United States Patent
Hao

(10) Patent No.: US 9,791,756 B2
(45) Date of Patent: Oct. 17, 2017

(54) PIXEL STRUCTURE OF LIQUID CRYSTAL DISPLAY PANEL AND MANUFACTURING METHOD THEREOF

(71) Applicant: Shenzhen China Star Optoelectronics Technology Co., Ltd., Shenzhen (CN)

(72) Inventor: Sikun Hao, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/907,826

(22) PCT Filed: Jan. 13, 2016

(86) PCT No.: PCT/CN2016/070815
§ 371 (c)(1),
(2) Date: Jan. 27, 2016

(87) PCT Pub. No.: WO2017/113442
PCT Pub. Date: Jul. 6, 2017

(65) Prior Publication Data
US 2017/0184934 A1    Jun. 29, 2017

(51) Int. Cl.
| | |
|---|---|
| G02F 1/1362 | (2006.01) |
| H01L 27/12 | (2006.01) |
| H01L 29/423 | (2006.01) |
| G02F 1/1343 | (2006.01) |
| G02F 1/136 | (2006.01) |

(52) U.S. Cl.
CPC .. *G02F 1/136213* (2013.01); *G02F 1/134363* (2013.01); *H01L 27/124* (2013.01); *H01L 27/1255* (2013.01); *H01L 27/1259* (2013.01); *H01L 29/42356* (2013.01); *G02F 2001/13606* (2013.01)

(58) Field of Classification Search
CPC ......... G02F 1/134363; G02F 1/136213; G02F 1/136286; G02F 2001/13606; H01L 27/124; H01L 27/1255; H01L 27/1259; H01L 29/42356
See application file for complete search history.

(56) References Cited

U.S. PATENT DOCUMENTS

2005/0259190 A1* 11/2005 Wang ................ G02F 1/136259
349/38

* cited by examiner

*Primary Examiner* — Laura Menz
*Assistant Examiner* — Candice Y Chan

(57) ABSTRACT

A pixel structure of a liquid crystal display panel and a manufacturing method thereof are provided, the pixel structure adopts a tri-gate frame, and one thin film transistor and one storage capacitor are simultaneously formed during the manufacturing process. The storage capacitor has a first via and a second via to connect a first capacitor layer and a second capacitor layer of the storage capacitor. A main storage portion of the storage capacitor further includes a lower portion of a common line, so as to substantially increase the capacity of the storage capacitor and reduce a feed through effect produced by the parasitic capacitor of the liquid crystal display panel, and to improve the display quality of the panel.

16 Claims, 5 Drawing Sheets

PIXEL STRUCTURE OF LIQUID CRYSTAL DISPLAY PANEL AND MANUFACTURING METHOD THEREOF

RELATED APPLICATIONS

This application is a National Phase of PCT patent application No. PCT/CN2016/070815 having International filing date of Jan. 13, 2016,which claims the benefit of priority of Chinese Patent Application No. 201511003474.2 filed on Dec. 28, 2015. The contents of the above applications are all incorporated by reference as if fully set forth herein in their entirety.

FIELD AND BACKGROUND OF THE INVENTION

The present invention relates to a pixel structure of a liquid crystal display panel and a manufacturing method thereof, and more particularly to a pixel structure of a liquid crystal display panel having a large capacity of a storage capacitor and a manufacturing method thereof.

Liquid crystal displays (LCD) are now the most widely used flat panel displays, they have a high resolution color screen, and are widely applied to various electronic devices, such as mobile phones, personal digital assistants (PDA), digital cameras, computer displays, or laptop computer displays. With the improvement of liquid crystal display technology, people have higher requirements for liquid crystal displays regarding their displaying quality, design appearance, lower cost, and higher transmission ratio.

By an IPS (In-Plane Switching) wide viewing angle technology, observers can see a minor axis of a liquid crystal molecule anytime, so there is no difference between viewing an image from each of the viewing angles, so as to improve the viewing angle of the liquid crystal display. In the first generation of the IPS technology, there has a completely new liquid crystal arrangement method to overcome the defects in a TN (twisted nematic) mode to accomplish a better viewing angle; in the second generation of the IPS technology (S-IPS, namely Super-IPS), a herringbone electrode has been adopted and a double domains mode has been introduced to improve a gray scale reverse phenomenon when the IPS mode is in some particular angles; and in the third generation of the IPS technology (AS-IPS, namely Advanced Super-IPS), the distance between the liquid crystal molecules and the aperture ratio are increased to obtain a higher brightness.

Refer now to FIG. 1, which is a schematic view of a pixel structure of a traditional IPS liquid crystal display panel. In a traditional IPS liquid crystal display panel, the range of a pixel structure 100 is defined by scan lines and data lines of the panel with a crisscross method, wherein the length direction of the pixel is set as a longitudinal direction, and the pixel adopts a herringbone electrode. The pixel structure 100 mainly comprises a scan line 110, a data line 120, a thin film transistor 130, a common line 140, a pixel electrode 150, and a common electrode 160. Additionally, the pixel structure 100 further comprises a storage capacitor 170, and the storage capacitor 170 is installed on the common line 140. However, because the traditional IPS liquid crystal display panel uses one data line 120 to correspond to one scan line 110, the amount of the data driving chips cannot be reduced, and because the capacity of the storage capacitor 170 is too small, a feed through effect is produced by a parasitic capacitor of the liquid crystal display panel, so it causes the panel to have a bad display.

Hence, it is necessary to provide a pixel structure of a liquid crystal display panel and a manufacturing method thereof which solve the problems existing in the conventional technologies.

SUMMARY OF THE INVENTION

The object of the present invention is to provide a pixel structure of a liquid crystal display panel and a manufacturing method thereof are provided, which adopt a tri-gate frame, and one thin film transistor and one storage capacitor are simultaneously formed during the manufacturing process. The storage capacitor includes a first via and a second via to connect a first capacitor layer and a second capacitor layer of the storage capacitor. A main storage portion of the storage capacitor further includes a lower portion of a common line, so as to substantially increase the capacity of the storage capacitor and reduce a feed through effect produced by the parasitic capacitor of the liquid crystal display panel, and to improve the display quality of the panel. Additionally, since the parasitic capacitor between the data line and the pixel electrode is reduced, a cross talk phenomenon of the panel is simultaneously improved.

To achieve the above object, the present invention provides a pixel structure of a liquid crystal display panel, formed on a substrate, which comprises:

a first metal layer formed on the substrate, and including a scan line and a gate electrode of a thin film transistor;

an active layer formed on the gate electrode;

a first insulation layer formed on the first metal layer and the active layer;

a second metal layer formed on the insulation layer, and including a data line, a common line, and a source electrode and a drain electrode of the thin film transistor, wherein the data line is connected with the source electrode; the thin film transistor is adjacent to the scan line and the data line; and the common line is parallel to the data line;

a second insulation layer formed on the second metal layer; and a transparent conductive layer formed above the second metal layer and including a pixel electrode and a common electrode;

wherein the pixel structure further comprises a storage capacitor which includes:

a first capacitor layer formed on one side of the pixel structure;

a second capacitor layer formed above the first capacitor layer, and having a first area and a second area, wherein the first area of the second capacitor layer is connected with the drain electrode; and the second area of the second capacitor layer is connected with the common line to form a protrusion of the common line;

a first via and a second via, wherein the first via is located at a border between the first capacitor layer and the first area of the second capacitor layer; a part of the first via is connected with the first capacitor layer, and the other part of the first via passes through and connects with the first area of the second capacitor layer, so that the first capacitor layer is connected with the second capacitor layer at this location; and the second via passes through the second area of the second capacitor layer, so that the first capacitor layer is connected with the second capacitor layer at this location; and a third capacitor layer having a first area and a second area, wherein a part of the first area of the third capacitor layer is located above the first via and is connected with the first via, and the other part of that is located above the common line and is connected with the pixel electrode; and the second area of the third capacitor layer is located above the second via and connected with the second via, and is connected with the common electrode.

In one embodiment of the present invention, the storage capacitor is between the data line and the common line.

In one embodiment of the present invention, the first area of the second capacitor layer is adjacent to the drain electrode.

In one embodiment of the present invention, the pixel electrode forms a plurality of comb-like branches from the first area of the third capacitor layer along a positive direction of the scan line; one part of the common electrode overlaps above the scan line, and the other part thereof is formed on the opposite side corresponding to the storage capacitor, and forms a plurality of comb-like branches along a negative direction of the scan line; and the comb-like branches of the pixel electrode and the comb-like branches of the common electrode correspond to and alternate with each other.

To achieve the above object, the present invention further provides a pixel structure of a liquid crystal display panel, formed on a substrate, which comprises:
- a first metal layer formed on the substrate, and including a scan line and a gate electrode of a thin film transistor;
- an active layer formed on the gate electrode;
- a first insulation layer formed on the first metal layer and the active layer;
- a second metal layer formed on the insulation layer, and including a data line, a common line, and a source electrode and a drain electrode of the thin film transistor, wherein the data line is connected with the source electrode;
- a second insulation layer formed on the second metal layer; and
- a transparent conductive layer formed above the second metal layer, and including a pixel electrode and a common electrode;
- wherein the pixel structure further comprises a storage capacitor which includes:
- a first capacitor layer formed on one side of the pixel structure;
- a second capacitor layer formed above the first capacitor layer, and having a first area and a second area, wherein the first area of the second capacitor layer is connected with the drain electrode; and the second area of the second capacitor layer is connected with the common line to form a protrusion of the common line;
- a first via and a second via, wherein the first via is located at a border between the first capacitor layer and the first area of the second capacitor layer; a part of the first via is connected with the first capacitor layer, and the other part of the first via passes through and connects with the first area of the second capacitor layer, so that the first capacitor layer is connected with the second capacitor layer at this location; and the second via passes through the second area of the second capacitor layer, so that the first capacitor layer is connected with the second capacitor layer at this location; and
- a third capacitor layer having a first area and a second area, wherein a part of the first area of the third capacitor layer is located above the first via and is connected with the first via, and the other part of that is located above the common line and is connected with the pixel electrode; and the second area of the third capacitor layer is located above the second via and connected with the second via, and is connected with the common electrode.

In one embodiment of the present invention, the thin film transistor is adjacent to the scan line and the data line.

In one embodiment of the present invention, the common line is parallel to the data line.

In one embodiment of the present invention, the storage capacitor is between the data line and the common line.

In one embodiment of the present invention, the first area of the second capacitor layer is adjacent to the drain electrode.

In one embodiment of the present invention, the pixel electrode forms a plurality of comb-like branches from the first area of the third capacitor layer along a positive direction of the scan line; one part of the common electrode overlaps above the scan line, and the other part thereof is formed on the opposite side corresponding to the storage capacitor, and forms a plurality of comb-like branches along a negative direction of the scan line; and the comb-like branches of the pixel electrode and the comb-like branches of the common electrode correspond to and alternate with each other.

To achieve the above object, the present invention further provides a manufacturing method of a pixel structure of a liquid crystal display panel, which comprises steps of:
- (a) forming a first metal layer on a substrate, wherein a scan line, a gate electrode of a thin film transistor, and a first capacitor layer of a storage capacitor are formed;
- (b) forming an active layer of the thin film transistor on the gate electrode;
- (c) forming a first insulation layer on the first metal layer and the active layer;
- (d) forming a second metal layer on the insulation layer, wherein a data line, a common line, a source electrode and a drain electrode of the thin film transistor, and a second capacitor layer of the storage capacitor are formed; the data line is connected with the source electrode, the second capacitor layer is formed above the first capacitor layer and has a first area and a second area; the first area of the second capacitor layer is connected with the drain electrode; and the second area of the second capacitor layer is connected with the common line, so as to form a protrusion of the common line;
- (e) forming a first via and a second via of the storage capacitor, wherein the first via is located at a border between the first capacitor layer and the first area of the second capacitor layer; a part of the first via is connected with the first capacitor layer, and the other part of the first via passes through and connects with the first area of the second capacitor layer, so that the first capacitor layer is connected with the second capacitor layer at this location; and the second via passes through the second area of the second capacitor layer, so that the first capacitor layer is connected with the second capacitor layer at this location;
- (f) forming a second insulation layer on the second metal layer; and
- (g) forming a transparent conductive layer above the second metal layer, wherein a pixel electrode, a common electrode, and a third capacitor layer of the storage capacitor are formed; the third capacitor layer has a first area and a second area; a part of the first area of the third capacitor layer is located above the first via and is connected with the first via, and the other part of that is located above the common line and is connected with the pixel electrode; and the second area of the third capacitor layer is located above the second via and connected with the second via, and is connected with the common electrode.

In one embodiment of the present invention, the thin film transistor is adjacent to the scan line and the data line.

In one embodiment of the present invention, the common line is parallel to the data line.

In one embodiment of the present invention, the storage capacitor is between the data line and the common line.

In one embodiment of the present invention, the first area of the second capacitor layer is adjacent to the drain electrode.

In one embodiment of the present invention, the pixel electrode forms a plurality of comb-like branches from the first area of the third capacitor layer along a positive direction of the scan line; one part of the common electrode overlaps above the scan line, and the other part thereof is formed on the opposite side corresponding to the storage capacitor, and forms a plurality of comb-like branches along a negative direction of the scan line; and the comb-like branches of the pixel electrode and the comb-like branches of the common electrode correspond to and alternate with each other.

DETAILED DESCRIPTION OF SPECIFIC EMBODIMENTS OF THE INVENTION

Figure 1:
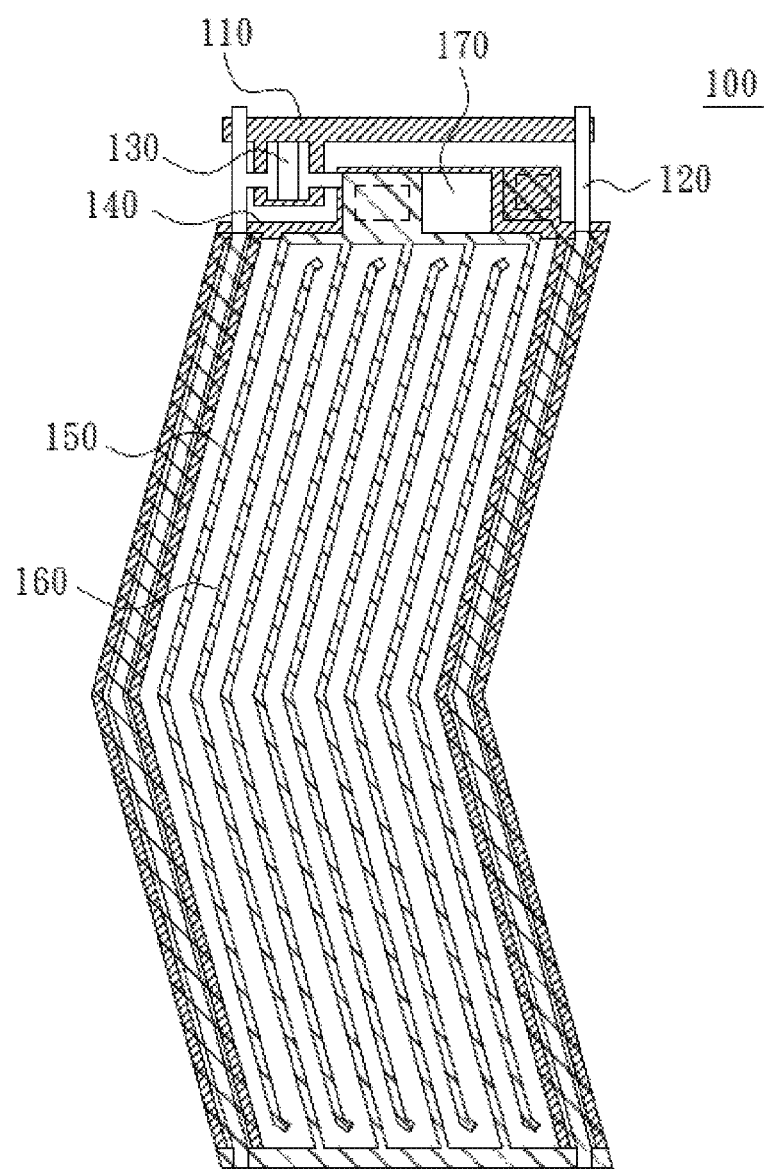
FIG. 1 is a schematic view of a pixel structure of a traditional IPS liquid crystal display panel.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto. In the drawings, units with similar structures use the same numerals.

Figure 2A:
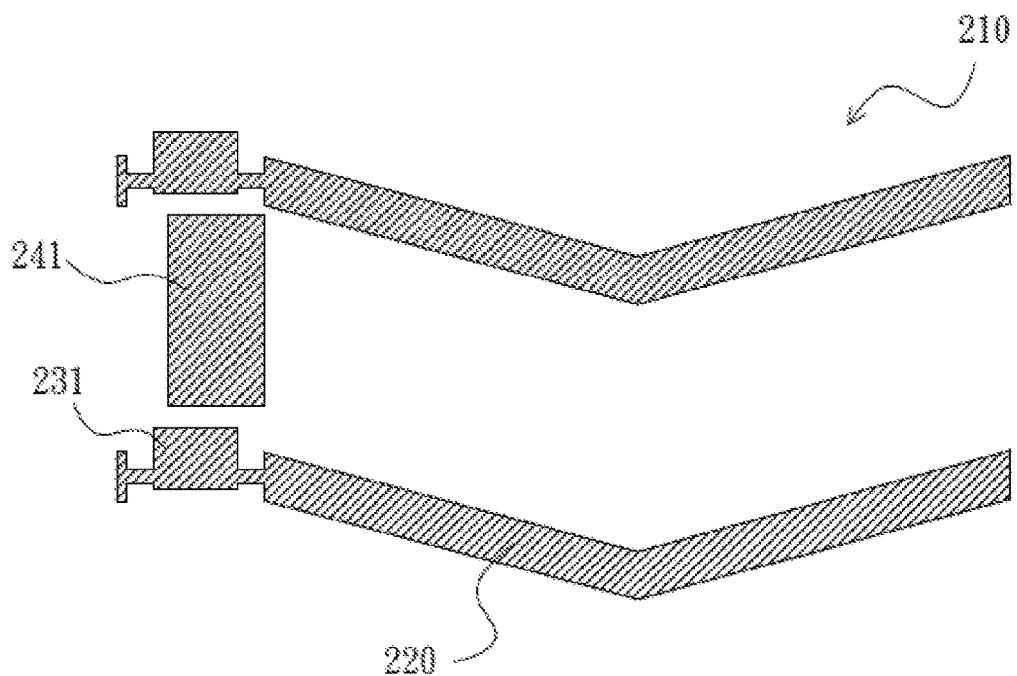
FIGS. 2A, 2B, 2C, 2D, and 2E are schematic views showing a manufacturing method of a pixel structure of a liquid crystal display panel according to a preferred embodiment of the present invention.
Figure 2B:
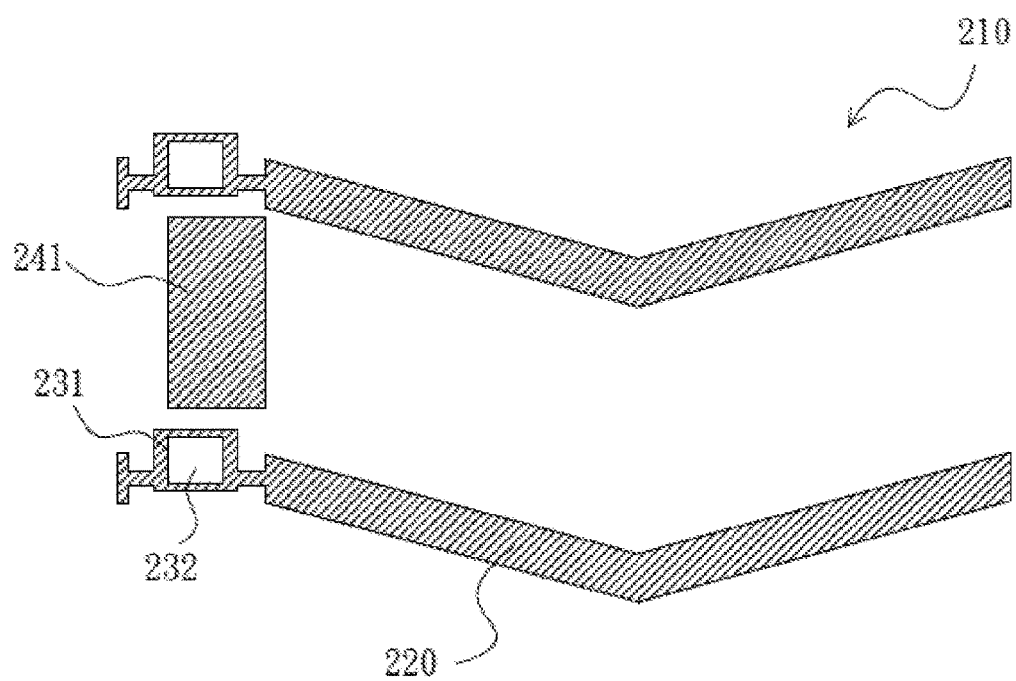
Figure 2C:
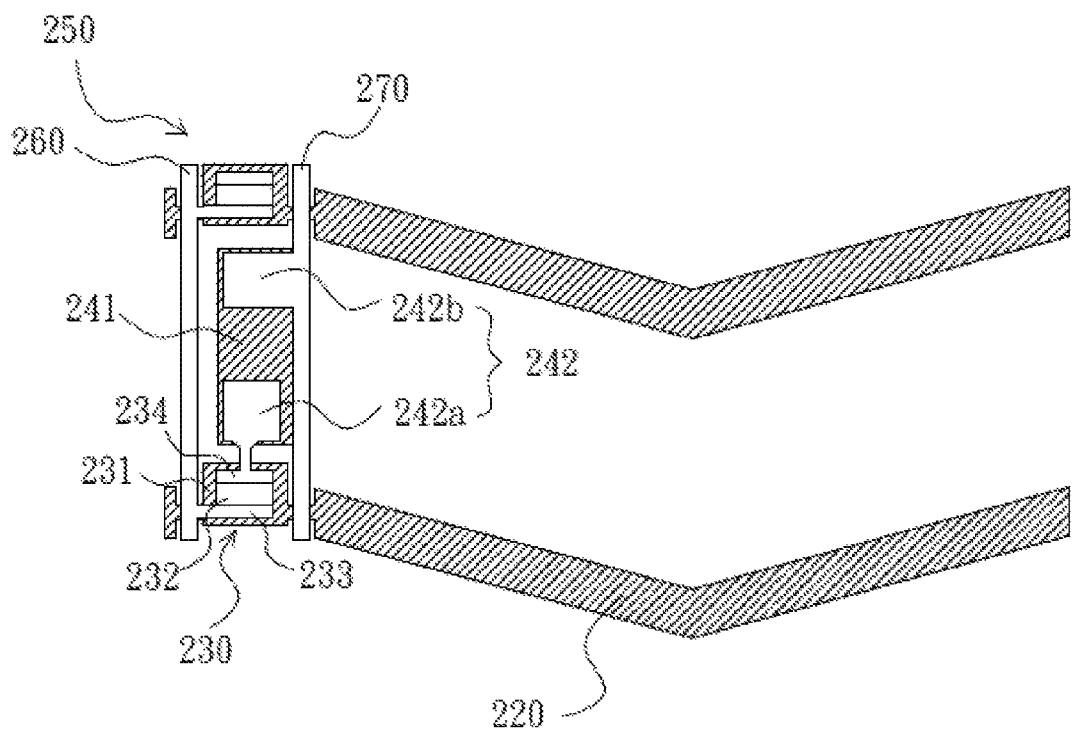
Figure 2D:
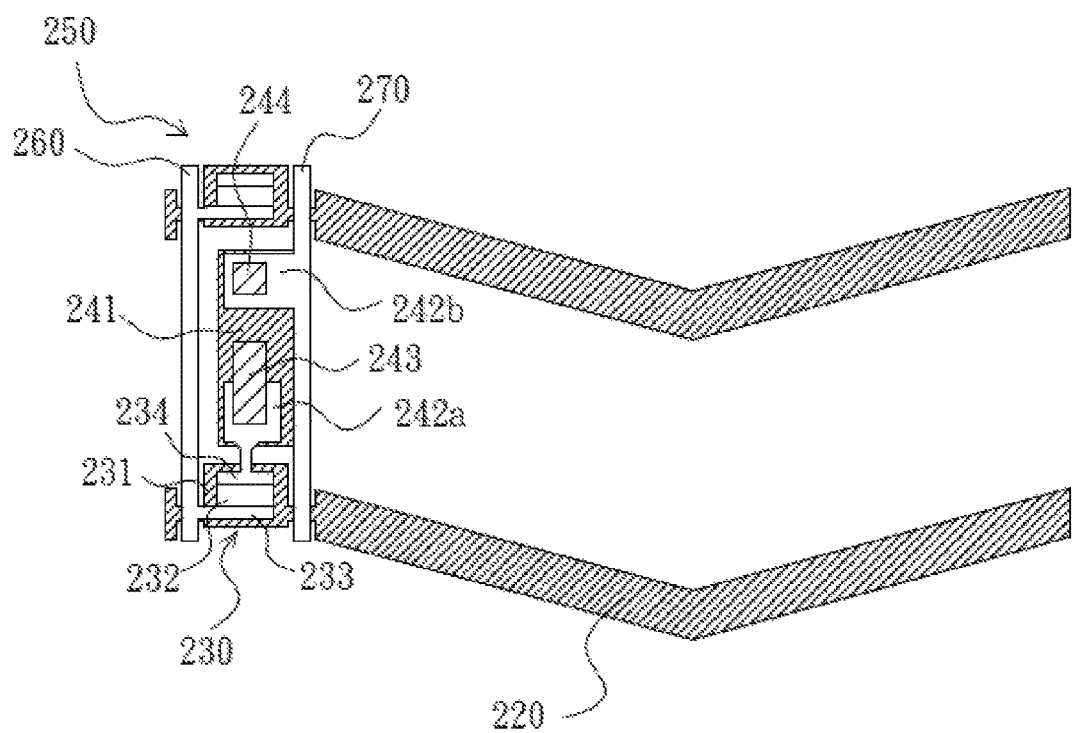
Figure 2E:
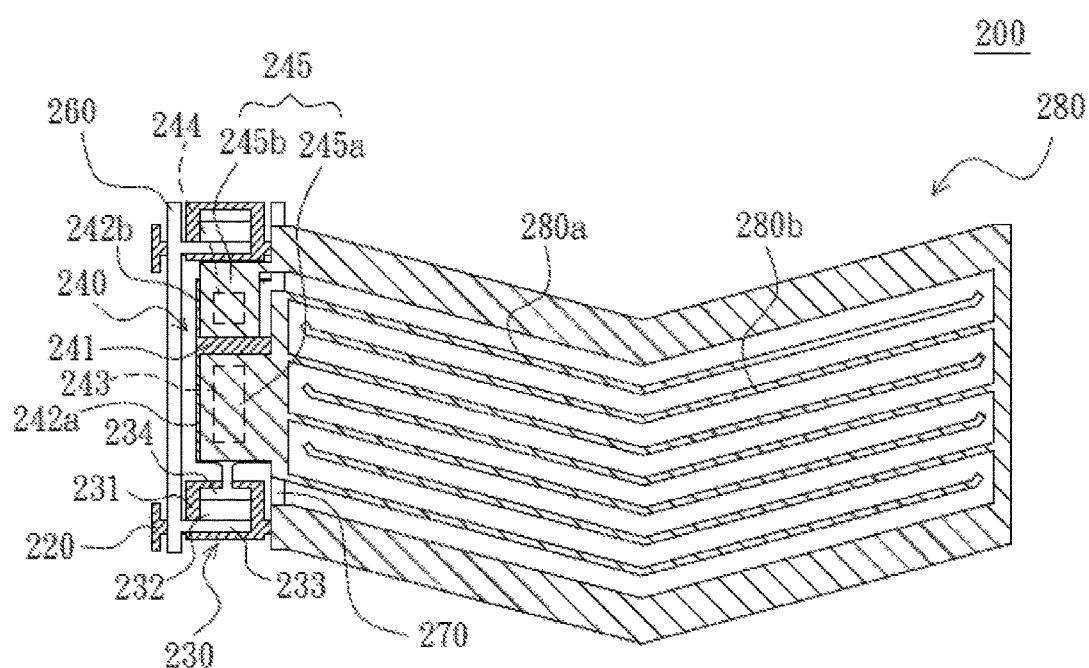

Refer now to FIGS. 2A, 2B, 2C, 2D, and 2E, which are schematic views showing a manufacturing method of a pixel structure of a liquid crystal display panel according to a preferred embodiment of the present invention. It should be noted that: the liquid crystal display panel of the present invention adopts a tri-gate frame, namely one data line corresponds to three scan lines; the length direction of the pixel is set as a latitudinal direction; and the pixel adopts a herringbone electrode, and introduces a double domains mode. The manufacturing method of the pixel structure of the present invention comprises following steps of:

(a) Refer to FIG. 2A, forming a first metal layer 210 on a substrate, wherein this step includes forming a scan line 220, a gate electrode 231 of a thin film transistor, and a first capacitor layer 241 of a storage capacitor;

(b) Refer to FIG. 2B, forming an active layer 232 of the thin film transistor on the gate electrode 231;

(c) forming a first insulation layer (not shown) on the first metal layer 210 and the active layer 232;

(d) Refer to FIG. 2C, forming a second metal layer 250 on the insulation layer, wherein this step includes forming a data line 260, a common line 270, a source electrode 233 and a drain electrode 234 of the thin film transistor, and a second capacitor layer 242 of the storage capacitor; wherein the data line 260 is connected with the source electrode 233, the second capacitor layer 242 is formed above the first capacitor layer 241 and has a first area 242a and a second area 242b; the first area 242a of the second capacitor layer is connected with the drain electrode 234; and the second area 242b of the second capacitor layer is connected with the common line 270, so as to form a protrusion of the common line 270;

(e) Refer to FIG. 2D, forming a first via 243 and a second via 244 of the storage capacitor, wherein the first via 243 is located at a border between the first capacitor layer 241 and the first area 242a of the second capacitor layer 242; a part of the first via 243 is connected with the first capacitor layer 241, and the other part of the first via 243 passes through and connects with the first area 242a of the second capacitor layer, so that the first capacitor layer 241 is connected with the second capacitor layer 242 at this location; and the second via 244 passes through the second area 242b of the second capacitor layer 242, so that the first capacitor layer 241 is connected with the second capacitor layer 242 at this location;

(f) forming a second insulation layer (not shown) on the second metal layer 250; and (g) Refer to FIG. 2E, forming a transparent conductive layer 280 above the second metal layer 250, wherein this step includes forming a pixel electrode 280a, a common electrode 280b, and a third capacitor layer 245 of the storage capacitor; the third capacitor layer 245 has a first area 245a and a second area 245b; a part of the first area 245a of the third capacitor layer is located above the first via 243 and is connected with the first via 243, and the other part of the first area 245a is located above the common line 270 and is connected with the pixel electrode 280a; and the second area 245b of the third capacitor layer is located above the second via 244 and connected with the second via 244, and is connected with the common electrode 280b.

Figure 3:
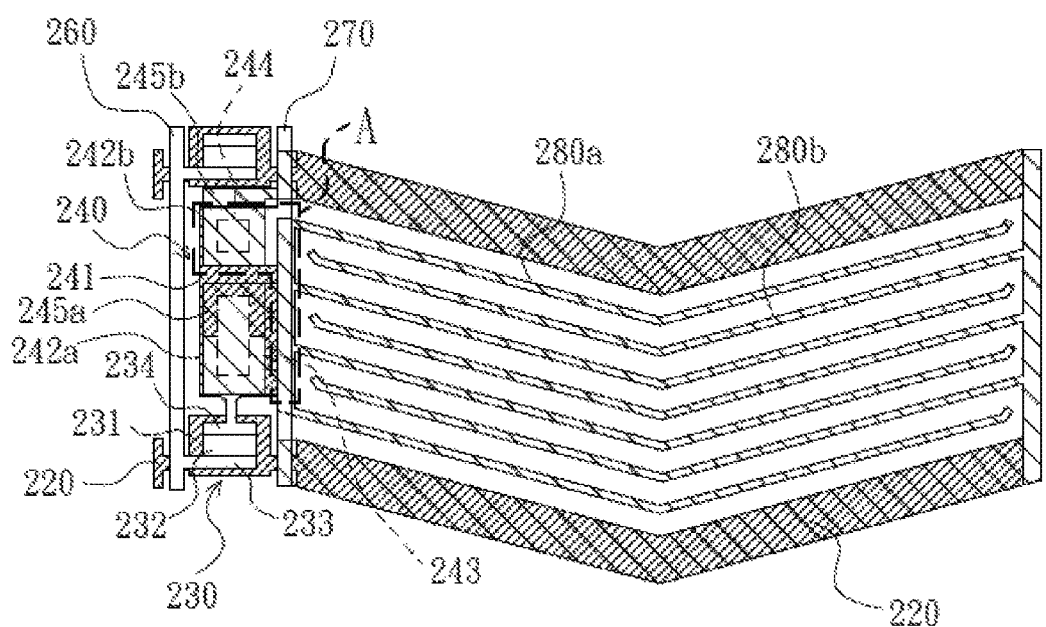
FIG. 3 is a schematic view of the pixel structure of the liquid crystal display panel according to the preferred embodiment of the present invention.

Refer now to FIGS. 2A, 2B, 2C, 2D, and 2E,and FIG.3, wherein FIG. 3 is a schematic view of the pixel structure of the liquid crystal display panel according to the preferred embodiment of the present invention. It should be noted that in order to clearly show the structure under the transparent conductive layer 280,compared with FIG. 2E, the transparent conductive layer 280 in FIG. 3 is shown as transparent parts. In the present invention, a pixel structure 200 of a liquid crystal display panel according to the present invention is formed by the above-mentioned steps (a)-(g), and one thin film transistor and one storage capacitor are simultaneously formed. The pixel structure 200 of the present invention is formed on a substrate, and the specific structure thereof, described as follows, comprises:

a first metal layer 210 formed on the substrate, and including a scan line 220 and a gate electrode 231 of a thin film transistor 230;

an active layer 232 formed on the gate electrode 231;

a first insulation layer (not shown) formed on the first metal layer 210 and the active layer 232;

a second metal layer 250 formed on the insulation layer, and including a data line 260, a common line 270, and a source electrode 233 and a drain electrode 234 of the thin film transistor, wherein the data line 260 is connected with the source electrode 233;

a second insulation layer (not shown) formed on the second metal layer 250;

a transparent conductive layer 280 formed above the second metal layer 250, and including a pixel electrode 280a and a common electrode 280b; and a storage capacitor 240, including:

a first capacitor layer 241 formed on one side of the pixel structure 200;

a second capacitor layer 242 formed above the first capacitor layer 241, and having a first area 242a and a second area 242b, wherein the first area 242a of the second capacitor layer is connected with the drain electrode 234; and the second area 242b of the second capacitor layer is connected with the common line 270 to form a protrusion of the common line 270;

a first via 243 and a second via 244, wherein the first via 243 is located at a border between the first capacitor layer 241 and the first area 242a of the second capacitor layer 242; a part of the first via 243 is connected with the first capacitor layer 241, and the other part of the first via 243 passes through and connects with the first area 242a of the second capacitor layer, so that the first capacitor layer 241 is connected with the second capacitor layer 242 at this location; and the second via 244 passes through the second area 242b of the second capacitor layer 242, so that the first capacitor layer 241 is connected with the second capacitor layer 242 at this location; and a third capacitor layer 245 having a first area 245a and a second area 245b, wherein a part of the first area 245a of the third capacitor layer is located above the first via 243 and is connected with the first via 243, and the other part of that is located above the common line 270 and is connected with the pixel electrode 280a; and the second area 245b of the third capacitor layer is located above the second via 244 and connected with the second via 244, and is connected with the common electrode 280b.

Preferably, the thin film transistor 230 is adjacent to the scan line 210 and the data line 260.

Preferably, the common line 270 is parallel to the data line 260.

Preferably, the storage capacitor 240 is between the data line 260 and the common line 270.

Preferably, the first area 242a of the second capacitor layer 242 is adjacent to the drain electrode 234.

Preferably, the pixel electrode 280a forms a plurality of comb-like branches from the first area 245a of the third capacitor layer along a positive direction of the scan line; one part of the common electrode 280b overlaps above the scan line 210, and the other part thereof is formed on the opposite side corresponding to the storage capacitor, and forms a plurality of comb-like branches along a negative direction of the scan line; and the comb-like branches of the pixel electrode 280a and the comb-like branches of the common electrode 280b correspond to and alternate with each other.

As mentioned above, in the present invention, the pixel structure 200 of the liquid crystal display panel according to the present invention is formed by the above-mentioned steps (a)-(g), and the thin film transistor 230 and the storage capacitor 240 are simultaneously formed. A main storage portion of the storage capacitor 240 is in the second area 245b of the third capacitor layer (a protrusion of the common line 270) and a lower portion of the common line 270 (an area as shown in a fringe line A in FIG. 3), so that it can substantially increase the capacity of the storage capacitor 240, so as to reduce a feed through effect produced by the parasitic capacitor of the liquid crystal display panel, and to improve the display quality of the panel. Since the parasitic capacitor between the data line 260 and the pixel electrode 280a is reduced, a cross talk phenomenon of the panel is simultaneously improved.

The present invention has been described with preferred embodiments thereof and it is understood that many changes and modifications to the described embodiment can be carried out without departing from the scope and the spirit of the invention that is intended to be limited only by the appended claims.

What is claimed is:

1. A pixel structure of a liquid crystal display panel, formed on a substrate, comprising:

a first metal layer formed on the substrate, and including a scan line and a gate electrode of a thin film transistor;

an active layer formed on the gate electrode;

a first insulation layer formed on the first metal layer and the active layer;

a second metal layer formed on the insulation layer, and including a data line, a common line, and a source electrode and a drain electrode of the thin film transistor, wherein the data line is connected with the source electrode; the thin film transistor is adjacent to the scan line and the data line; and the common line is parallel to the data line;

a second insulation layer formed on the second metal layer; and a transparent conductive layer formed above the second metal layer, and including a pixel electrode and a common electrode;

wherein the pixel structure further comprises a storage capacitor which includes:

a first capacitor layer formed on one side of the pixel structure;

a second capacitor layer formed above the first capacitor layer, and having a first area and a second area, wherein the first area of the second capacitor layer is connected with the drain electrode; and the second area of the second capacitor layer is connected with the common line to form a protrusion of the common line;

a first via and a second via, wherein the first via is located at a border between the first capacitor layer and the first area of the second capacitor layer; a part of the first via is connected with the first capacitor layer, and the other part of the first via passes through and connects with the first area of the second capacitor layer, so that the first capacitor layer is connected with the second capacitor layer at this location; and the second via passes through the second area of the second capacitor layer, so that the first capacitor layer is connected with the second capacitor layer at this location; and a third capacitor layer having a first area and a second area, wherein a part of the first area of the third capacitor layer is located above the first via and is connected with the first via, and the other part of that is located above the common line and is connected with the pixel electrode; and the second area of the third capacitor layer is located above the second via and connected with the second via, and is connected with the common electrode.

2. The pixel structure according to claim 1, wherein the storage capacitor is between the data line and the common line.

3. The pixel structure according to claim 1, wherein the first area of the second capacitor layer is adjacent to the drain electrode.

4. The pixel structure according to claim 1, wherein the pixel electrode forms a plurality of comb-like branches from the first area of the third capacitor layer along a positive direction of the scan line; one part of the common electrode overlaps above the scan line, and the other part thereof is formed on the opposite side corresponding to the storage capacitor, and forms a plurality of comb-like branches along a negative direction of the scan line; and the comb-like branches of the pixel electrode and the comb-like branches of the common electrode correspond to and alternate with each other.

5. A pixel structure of a liquid crystal display panel, formed on a substrate, comprising:
   a first metal layer formed on the substrate, and including a scan line and a gate electrode of a thin film transistor;
   an active layer formed on the gate electrode;
   a first insulation layer formed on the first metal layer and the active layer;
   a second metal layer formed on the insulation layer, and including a data line, a common line, and a source electrode and a drain electrode of the thin film transistor, wherein the data line is connected with the source electrode;
   a second insulation layer formed on the second metal layer; and
   a transparent conductive layer formed above the second metal layer, and including a pixel electrode and a common electrode;
   wherein the pixel structure further comprises a storage capacitor which includes:
   a first capacitor layer formed on one side of the pixel structure;
   a second capacitor layer formed above the first capacitor layer, and having a first area and a second area, wherein the first area of the second capacitor layer is connected with the drain electrode; and the second area of the second capacitor layer is connected with the common line to form a protrusion of the common line;
   a first via and a second via, wherein the first via is located at a border between the first capacitor layer and the first area of the second capacitor layer; a part of the first via is connected with the first capacitor layer, and the other part of the first via passes through and connects with the first area of the second capacitor layer, so that the first capacitor layer is connected with the second capacitor layer at this location; and the second via passes through the second area of the second capacitor layer, so that the first capacitor layer is connected with the second capacitor layer at this location; and
   a third capacitor layer having a first area and a second area, wherein a part of the first area of the third capacitor layer is located above the first via and is connected with the first via, and the other part of that is located above the common line and is connected with the pixel electrode; and the second area of the third capacitor layer is located above the second via and connected with the second via, and is connected with the common electrode.

6. The pixel structure according to claim 5, wherein the thin film transistor is adjacent to the scan line and the data line.

7. The pixel structure according to claim 5, wherein the common line is parallel to the data line.

8. The pixel structure according to claim 5, wherein the storage capacitor is between the data line and the common line.

9. The pixel structure according to claim 5, wherein the first area of the second capacitor layer is adjacent to the drain electrode.

10. The pixel structure according to claim 5, wherein the pixel electrode forms a plurality of comb-like branches from the first area of the third capacitor layer along a positive direction of the scan line; one part of the common electrode overlaps above the scan line, and the other part thereof is formed on the opposite side corresponding to the storage capacitor, and forms a plurality of comb-like branches along a negative direction of the scan line; and the comb-like branches of the pixel electrode and the comb-like branches of the common electrode correspond to and alternate with each other.

11. A manufacturing method of a pixel structure of a liquid crystal display panel, comprising steps of:
   (a) forming a first metal layer on a substrate, wherein a scan line, a gate electrode of a thin film transistor, and a first capacitor layer of a storage capacitor are formed;
   (b) forming an active layer of the thin film transistor on the gate electrode;
   (c) forming a first insulation layer on the first metal layer and the active layer;
   (d) forming a second metal layer on the insulation layer, wherein a data line, a common line, a source electrode and a drain electrode of the thin film transistor, and a second capacitor layer of the storage capacitor are formed; wherein the data line is connected with the source electrode, the second capacitor layer is formed above the first capacitor layer and has a first area and a second area; the first area of the second capacitor layer is connected with the drain electrode; and the second area of the second capacitor layer is connected with the common line, so as to form a protrusion of the common line;
   (e) forming a first via and a second via of the storage capacitor, wherein the first via is located at a border between the first capacitor layer and the first area of the second capacitor layer; a part of the first via is connected with the first capacitor layer, and the other part of the first via passes through and connects with the first area of the second capacitor layer, so that the first capacitor layer is connected with the second capacitor layer at this location; and the second via passes through the second area of the second capacitor layer, so that the first capacitor layer is connected with the second capacitor layer at this location;
   (f) forming a second insulation layer on the second metal layer; and
   (g) forming a transparent conductive layer above the second metal layer, wherein a pixel electrode, a common electrode, and a third capacitor layer of the storage capacitor are formed; the third capacitor layer has a first area and a second area; a part of the first area of the third capacitor layer is located above the first via and is connected with the first via, and the other part of that is located above the common line and is connected with the pixel electrode; and the second area of the third capacitor layer is located above the second via and connected with the second via, and is connected with the common electrode.

12. The manufacturing method according to claim 11, wherein the thin film transistor is adjacent to the scan line and the data line.

13. The manufacturing method according to claim 11, wherein the common line is parallel to the data line.

14. The manufacturing method according to claim 11, wherein the storage capacitor is between the data line and the common line.

15. The manufacturing method according to claim 11, wherein the first area of the second capacitor layer is adjacent to the drain electrode.

16. The manufacturing method according to claim 11, wherein the pixel electrode forms a plurality of comb-like branches from the first area of the third capacitor layer along a positive direction of the scan line; one part of the common electrode overlaps above the scan line, and the other part thereof is formed on the opposite side corresponding to the storage capacitor, and forms a plurality of comb-like branches along a negative direction of the scan line; and the comb-like branches of the pixel electrode and the comb-like branches of the common electrode correspond to and alternate with each other.

* * * * *

UNITED STATES PATENT AND TRADEMARK OFFICE
CERTIFICATE OF CORRECTION

| | |
|---|---|
| PATENT NO. | : 9,791,756 B2 |
| APPLICATION NO. | : 14/907826 |
| DATED | : October 17, 2017 |
| INVENTOR(S) | : Sikun Hao |

Page 1 of 1

It is certified that error appears in the above-identified patent and that said Letters Patent is hereby corrected as shown below:

On the Title Page

Item (30) Foreign Application Priority Data insert the following:
-- Dec. 28, 2015 (CN)...................2015 1 1003474.2 --

Signed and Sealed this
Twenty-second Day of May, 2018

Andrei Iancu
*Director of the United States Patent and Trademark Office*